United States Patent
Kelley

[11] 4,151,517
[45] Apr. 24, 1979

[54] CLOSED LOOP COMPANDING RATIO CONTROL FOR CONTINUOUSLY VARIABLE SLOPE DELTA MODULATION

[75] Inventor: Stephen H. Kelley, Tempe, Ariz.

[73] Assignee: Motorola, Inc., Schaumburg, Ill.

[21] Appl. No.: 768,117

[22] Filed: Feb. 14, 1977

[51] Int. Cl.² ............................................ H03K 13/22
[52] U.S. Cl. ........................... 340/347 C; 325/38 B; 340/347 AD
[58] Field of Search .................. 340/347 C, 347 AD; 325/38 B; 332/11 D

[56] References Cited

U.S. PATENT DOCUMENTS

| | | | |
|---|---|---|---|
| 3,729,678 | 4/1973 | Glasbergen | 325/38 B |
| 3,806,806 | 4/1974 | Brolin | 325/38 B |
| 3,831,092 | 8/1974 | Greefkes | 325/38 B |
| 3,868,574 | 2/1975 | Ferrieu | 325/38 B |
| 3,922,606 | 11/1975 | Nordling | 325/38 B |
| 3,995,218 | 11/1976 | Moriya | 325/38 B |
| 4,042,921 | 8/1977 | Smith | 340/347 AD |

OTHER PUBLICATIONS

Jayant, "Proceedings of the IEEE", vol. 62, No. 5, May 1974, pp. 611-632.

*Primary Examiner*—Charles D. Miller
*Attorney, Agent, or Firm*—Joe E. Barbee

[57] ABSTRACT

A monolithic integrated circuit encoder/decoder capable of converting an analog signal to a digital signal and capable of reconstructing an analog signal from a digital signal employing continuously variable slope delta modulation. The dynamic range of the continuous variable slope delta modulation is increased by employing means for providing a companding ratio reference coupled to a means for comparing the companding ratio reference against a filtered coincidence output from the encoder/decoder and then amplifying any difference therebetween. The difference is used to control the gain of the continuously variable slope delta modulator and can be used to modify the companding ratio reference to provide a closed-loop controlled companding ratio for the encoder/decoder.

14 Claims, 3 Drawing Figures

CLOSED LOOP COMPANDING RATIO CONTROL FOR CONTINUOUSLY VARIABLE SLOPE DELTA MODULATION

BACKGROUND OF THE INVENTION

This invention relates, in general, to encoders/decoders, and more particularly, to those encoders/decoders employing continuously variable slope delta modulation.

In the communications field it is often desirable to convert audio analog signals to digital signals for transmission purposes. Signal-to-noise ratios do not vary with distance in digital transmissions. In addition, multiplexing, switching, and repeating hardware which is used for digital transmission is more economical and ofter simpler than having individual lines to carry analog signals in addition to analog handling equipment. However, instrumentation analog-to-digital converters do not always meet communications performance requirements. Continuously variable slope delta modulation analog-to-digital converters are well suited to the requirements of digital communications and are an economically efficient means of digitizing analog inputs for digital transmission.

The innermost control loop of a CVSD converter is a simple delta modulator. A simple delta modulator consists of a comparator in the forward path and an integrator in the feedback path of simple control loop. The inputs of the comparator are the input analog signal and the integrator output. The comparator output reflects the sign of the difference between the input analog voltage and the integrator output. That sign bit is a digital output and controls the direction of ramp in the integrator. The comparator is clocked so as to produce a synchronous and band limited digital bit stream. If the clocked serial bit stream is transmitted to a similar integrator at a remote point, the remote integrator output is a copy of the transmitting control loop integrator output. To the extent that the integrator at the transmitting location tracks the input signal, the remote receiver reconstructs the input signal. Low pass filtering at the receiver output will eliminate most of the quantizing noise if the clock rate of the bit stream is an octave or more above the bandwidth of the input signal. Voice bandwidth is typically 4 KHz and clock rates from 8 KHz and up are possible. Thus, the delta modulator digitizes and transmits the analog input to a remote receiver. The serial, unframed nature of the data is ideal for communications networks. With no input at the transmitter it is customary to transmit a continuous one-zero alternation bit stream. By making both the transmitting and receiving integrators leaky, then during any loss of contact the receiver output decays to zero and receive-restart begins without framing when the receiver reacquires.

The fundamental advantages of the delta modulator are its simplicity and serial format of its output. Its limitations are its ability to accurately convert the input within a limited digital bit rate. The analog input must be frequency limited and amplitude limited. The frequency limitations are governed by the Nyquist rate while the amplitude capabilities are set by the gain of the integrator. For a given signal level, one specific gain will achieve an optimum noise level. Unfortunately, the basic delta modulator has a small dynamic range over which the noise level is constant. In the past, the dynamic range of the basic delta modulator was increased slightly by employing a digital algorithm in conjunction with a low pass filter to control the gain of the integrator of the delta modulator. Although such a scheme did produce slight gains in the dynamic range, it was an open-loop control which did not provide a maximum obtainable dynamic range.

Accordingly, it is an object of the present invention to provide an improved encoder/decoder using continuously variable slope delta modulation.

Another object of the present invention is to provide an encoder/decoder having a dynamic range, with flat signal-to-noise ratio, on the order of 50 dB.

Yet another object of the present invention is to control gain of a delta modulator/demodulator by comparing a companding ratio of a continuously variable slope delta modulation to a companding ratio reference.

Another object of the present invention is to provide a closed-loop controlled companding ratio reference which improves the dynamic range of continuously variable slope delta modulation.

A further object of the present invention is to provide a control for continuously variable slope delta modulation circuit having improved temperature stability.

SUMMARY OF THE INVENTION

In carrying out the above and other objects in one preferred form there is provided an encoder/decoder employing a continuously variable slope delta modulation with an improved closed-loop companding ratio control. The encoder/decoder is capable of converting an analog signal to a digital signal and capable of reconstructing an analog signal from a digital signal. The closed-loop companding ratio control includes means for providing a companding ratio reference and means for comparing the companding ratio reference against a filtered coincidence output from the encoder/decoder. Any difference therebetween is amplified and coupled to the integrator of the continuously variable slope delta modulation portion of the encoder/decoder to control the gain of the integrator.

Another embodiment of the invention is to use the difference to modify the companding ratio reference thereby providing a closed-loop controlled companding ratio reference.

The subject matter which is regarded as the invention is particularly pointed out and distinctly claimed in the concluding portion of this specification. The invention itself, however, together with further objects and advantages thereof, may be better understood by reference to the following description taken in conjunction with the accompanying drawings.

Figure 1:
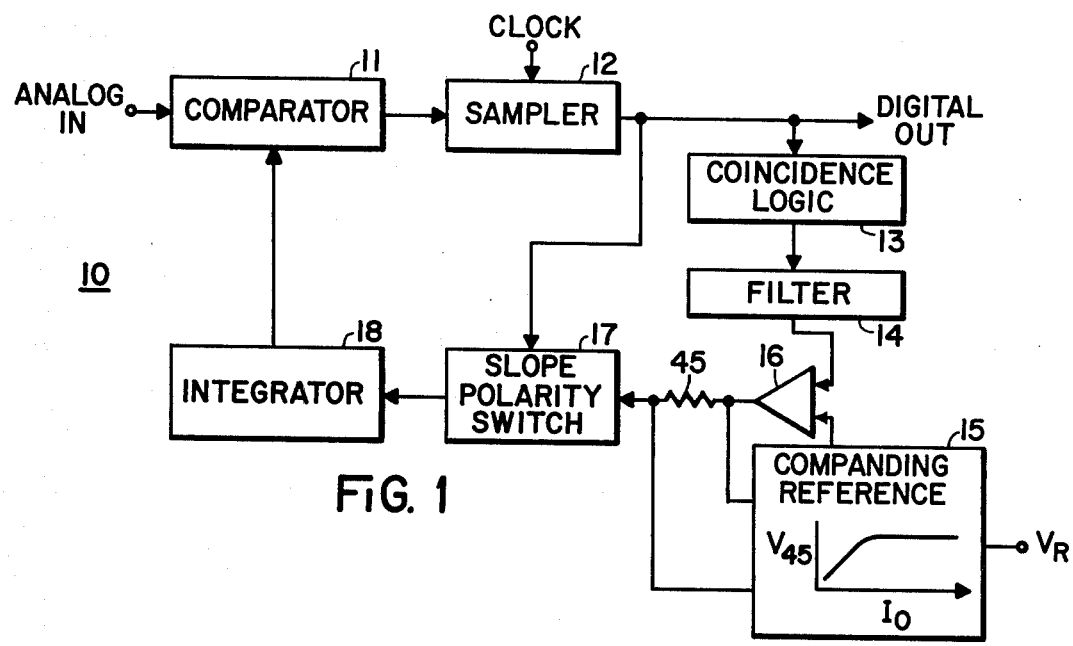
FIG. 1 is block diagram of an encoder using continuously variable slope delta modulation controlled by one embodiment of the invention.

The exemplifications set out herein illustrate the preferred embodiment of the invention in one form thereof, and such exemplifications are not to be construed as limiting in any manner the scope of the invention.

DESCRIPTION OF THE PREFERRED EMBODIMENT

A simplified delta modulator which can be found in an analog-to-digital encoder can be formed by an inner control loop having a comparator and an integrator. The comparator compares the present analog input with the integrator output and loads one bit quantization of the difference into a clock flip-flop. The flip-flop output is transmitted and delivered to a similar system at a remote location where an open-loop integrator reproduces the analog signal from the received digital bit stream. The majority of quantization noise can be removed by a low pass filter following the integrator in the receiver. Simple delta modulators have limited dynamic ranges due to the constant gain of the integrator. An outer control loop associated with continuously variable slope delta modulation consists of a digital algorithm to coincidence logic and a low pass filter which generate a DC level proportional to the input signal level. That level can then be used to control the gain of the integrator and increase the encoder's dynamic range. The complexity of the control for the gain of the integrator varies according to the desired dynamic range performance and the clock rate. Such a control is commonly called a slope magnitude controller and comprises coincidence logic, syllabic filter, and a difference amplifier. The digital algorithm can vary from three to four bits of information, depending upon the application of the encoder. The output of the slope magnitude controller is then converted to two matched currents of opposite sign by a slope polarity switch. One of the two currents is injected into the integrator, depending upon the present sign or digital output state. At the receiver, the gain control information is recovered from the digital bit stream by a similar slope magnitude controller. The signal-to-noise performance of the encoder/decoder is largely dependent upon the quality of the slope control predictions once the opposite polarity matching of the slope polarity switch has been properly compensated for.

For a given clock frequency and input bandwidth, additional circuitry is used to increase the delta modulator's dynamic range. External to the basic delta modulator, the digital algorithm monitors the past few outputs or bits from the delta modulator in a simple shift register. The algorithm simply monitors the contents of the shift register and indicates if it contains all logic ones or all logic zeros. The shift register is typically three or four bits long, depending upon the desired performance. A condition called coincidence occurs when the shift register contains all logic ones or logic zeros. When coincidence occurs it indicates that the gain of the integrator must be adjusted. The coincidence output drives a low pass filter also known as a syllabic filter. The syllabic filter derives its name from the syllabic nature of a person's voice. The voltage output of the syllabic filter controls the integrator gain through a voltage to current converter and a slope polarity switch whose other input is a sign bit or the up-down control of the delta modulator. Other control algorithms using the shift register have been attempted, however, the all "ones" or all "zeros" algorithm has proven not only simpler but more effective. The key to the accepted algorithm is that it provides a measure of the average power or level of the input signal. The purpose of the algorithm is to control the gain of the integrator and to increase the overall dynamic range. By monitoring both the coincidence of ones and zeros the shift register performs a function similar to a full wave bridge rectifier.

The algorithm is repeated in the receiver and thus the level data is recoverable at the receiver. Since the algorithm only operates on the past serial data, it changes the nature of the bit stream without changing the channel bit rate. The bit stream in the channel is as if it were from a standard delta modulator with a constant level input.

An encoder 10 is illustrated in FIG. 1. An analog input signal is fed into a comparator 11. The output of comparator 11 is clocked through a sampler 12 by a clock input signal. A portion of the output of sampler 12 is coupled to a slope polarity switch 17 whose output drives integrator 18. The output of integrator 18 is coupled to an input of comparator 11 where it is compared against the analog input. Integrator 18 is chosen to meet two simple constraints. First, it must be an integrator throughout the voice band and second, it must be leaky so that bit errors can be tolerated and loss of receiver contact does not require an external reset for reacquisition. The output of sampler 12 is a digital output signal of encoder 10. A portion of this output is coupled to a coincidence logic 13 which monitors the output signal to determine if a predetermined number of bits in the output are all logic zeros or all logic ones. When a series of ones or zeros exist, coincidence logic 13 produces an output which is coupled to a low pass filter 14. The output of filter 14 is coupled to a circuit 16 which compares the filter output against a companding ratio reference and amplifies the difference. The amplified difference is coupled through resistor 45, as a current, to slope polarity switch 17 to control the operation of switch 17. The reference that is coupled to circuit 16 is supplied by companding ratio reference 15. The output of companding ratio reference 15 is derived by a voltage, $V_R$, modified by the current supplied by circuit 16. The current out of circuit 16 is taken as a voltage across resistor 45 and is coupled to companding ratio reference 15. The response of companding ratio reference 15 is non-linear as illustrated by the $V_{45}$ versus $I_0$ curve in reference 15. This portion of encoder 10 provides a closed-loop companding ratio control for a continuously variable slope delta modulator. A simple delta modulator would consist only of comparator 11 and sampler 12 in the forward direction and of integrator 18 in the feedback path. A basic continuously variable slope delta modulator comprises the simple delta modulator and the filter 14 output coupled to resistor 45.

The prime design constraint of a continuously variable slope delta modulation channel is the channel bit rate. Since delta modulators produce a serial unframed bit stream, the bit rate and sample frequency are the same. It will be noted that as the clock rate increases so will the end-to-end performance of the encoder. Clocked rates from 9600 Hz to 64 KHz can be used in various applications. Clock rates of 16 KHz, 32 KHz, and 37.7 KHz have the greatest acceptance in practical voice communication equipment. Once the system bit rate has been selected the shift register length selection must be made. The length of the shift register determines the amount of past history which will be taken into account in predicting slope. As the clock rate changes, so does the amount of signal time recorded by the shift register. Therefore, at rates below 16 KHz a 3 bit algorithm produces the best results. From 16 KHz bits and up, either three or four bits may be used. Four bit algorithms provide flatter signal-to-noise performance because they account for a longer average pass history of steady state signals. However, the transient response to level changes is slightly degraded because of the slower companding response.

Figure 2:
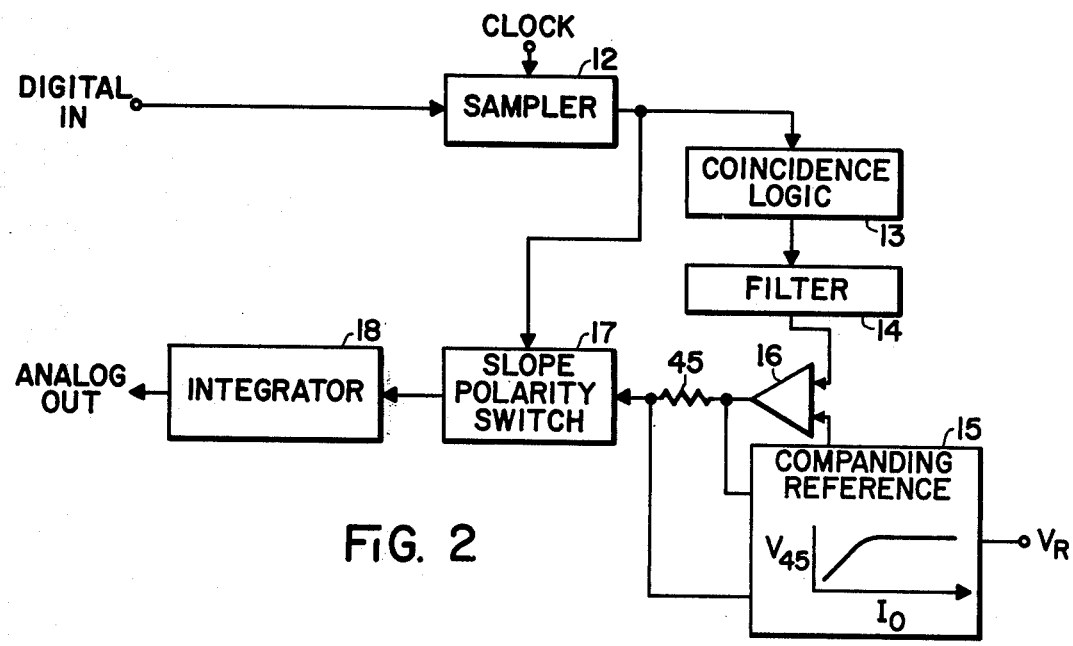
FIG. 2 is a block diagram of a decoder for the output signal of the circuit of FIG. 1 and employing an embodiment of the invention.

FIG. 2 is a block diagram of a decoder which is capable of taking the digital output from the circuit of FIG. 1 and reconstructing an analog output signal similar to the analog input signal processed by encoder 10. As described hereinbefore, the decoder employs the same circuitry as the encoder, however, the integrator 18 in the decoder does not form a closed-loop with a comparator. In FIG. 2 the digital input is coupled to sampler 12 where it is clocked through sampler 12 and coupled to slope polarity switch 17. A portion of the output of sampler 12 is also coupled to coincidence logic 13 whose output is coupled to a low pass filter 14. The output of low pass filter 14 is compared against a companding ratio reference 15 by circuit 16 and then amplified and coupled to slope polarity switch 17 to control the output polarity of switch 17 and the magnitude of the current therefrom. The output of slope polarity switch 17 is coupled to an integrator 18 which produces an analog output signal that is a reconstructed signal of an analog signal used to produce the digital input appearing at sampler 12. Slope polarity switch 17 can be thought of as a pulse amplitude modulator. It should be noted that the decoder of FIG. 2 also contains closed-loop companding ratio reference control as does the encoder of FIG. 1.

Another embodiment of the present invention, which is simpler to implement than that illustrated in FIGS. 1 and 2, is to replace companding ratio reference 15 by a fixed reference voltage which will be an improvement over the prior art, however, will not increase the dynamic range of the encoder/decoder as much as will the embodiment of FIGS. 1 and 2. In this simpler version, there would not be a connection from resistor 45 to the fixed reference voltage.

The feedback gain of a continuously variable slope delta modulation encoder/decoder is set by the magnitude of the output of circuit 16 which is coupled to slope polarity switch 17. Since the continuously variable slope delta modulation algorithm improves the dynamic range of a delta modulator for lower level inputs, the selection of loop gains should be based on the near maximum amplitude and frequency signal which must be transmitted. Experimental data shows that a continuously variable slope delta modulation encoder/decoder produces optimum signal-to-noise ratio when the companding algorithm is active between 5% and 25% of the time. Taking this into account, the output of circuit 16 can be selected by determining the required integrator current which will produce the needed step size for a specified input signal. Thus, circuit 16 should supply the required current when the low pass filter or syllabic filter 14 output is about 25% of its maximum value. However, the minimal step size required must also be considered. With no input the continuously variable slope delta modulation digital output becomes a one-zero alternating pattern and the analog output becomes a small triangle wave. The peak-to-peak value of that triangular wave is the idle channel step size. Its meaning is analogous to the plus or minus one-half least significant bit (LSB) quantization error of a conventional digital-to-analog converter. The encoder/decoder cannot resolve or transmit signal levels smaller than the minimum step size. In theory one would wish to make this parameter go to zero, however, practical errors such as up and down ramp matching, comparator hysteresis, and filter operational amplification offsets combine to cause the idle channel analog output to drift away from the zero DC reference.

Figure 3:
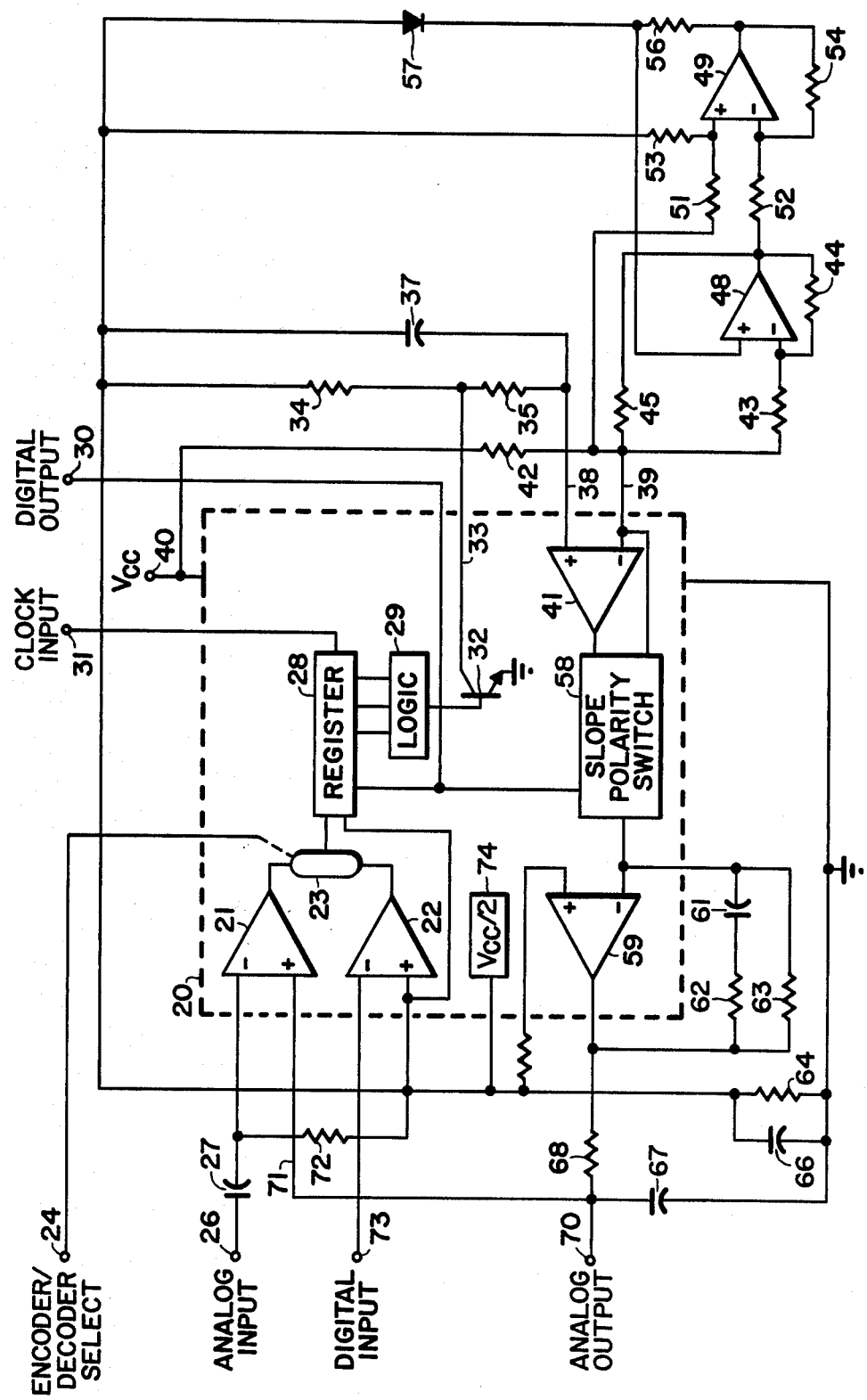
FIG. 3 illustrates partly in schematic form and partly in block diagram form an encoder/decoder employing the present invention in one form.

FIG. 3 illustrates a telephone quality delta modulator encoder. A monolithic integrated circuit continuously variable slope delta modulator/demodulator 20 has a comparator 21 and a comparator 22 to receive input signals. An analog input signal appearing at terminal 26 is coupled to comparator 21 by capacitor 27. Switch 23 determines whether circuit 20 will be used as an encoder to encode analog input signals or a decoder to decode digital input signals. Switch 23 is controlled by an analog/digital select signal appearing at terminal 24. The encoder function of the circuit will be described first. The output of comparator 21 is coupled to shift register 28 by switch 23. The information is shifted through register 28 by a clock input signal appearing at terminal 31. As discussed hereinbefore, register 28 can either be a 3 bit or a 4 bit register. The output of register 28 is monitored by a logic circuit 29. Logic circuit 29 is a coincidence logic detector and produces an output whenever register 28 contains all logic ones or all logic zeros. Register 28 and logic circuit 29 form what is called a digital algorithm. When logic circuit 29 produces an output it enables transistor 32. Whenever coincidence occurs line 33 is coupled to ground reference by transistor 32. One end of line 33 is connected to a junction formed by resistors 34 and 35. Capacitor 37 is in parallel with resistors 34 and 35. One end of resistor 34 and capacitor 37 is coupled to a voltage source 74 which provides one-half of the voltage, $V_{CC}$, which is applied to terminal 40 as the power source for circuit 20. The other end of capacitor 37 along with resistor 35 is connected to line 38. Line 38 is connected to a unity gain configured operational amplifier 41. Since the inputs of operational amplifier 41 are virtually shorted to each other the signal on line 38 also appears on line 39. Line 39 is coupled to the inverting input of amplifier 48 through resistor 43. Resistor 44 is connected from the output of amplifier 48 to the inverting input and cooperates with the resistor 43 to establish the gain for amplifier 48. Line 39 is also coupled, through resistor 42, to terminal 40 which is the $V_{CC}$ supply. Resistor 45 couples the output of amplifier 48 to line 39. Line 39 is also coupled to the noninverting input of amplifier 49 through resistor 51. Resistor 52 couples a portion of the output of amplifier 48 to the inverting input of amplifier 49. Resistors 53 and 54 cooperate with resistors 51 and 52 to establish the gain for amplifier 49. The output of amplifier 49 is coupled through resistor 56 to the cathode of a diode 57. The junction formed by the cathode of diode 57 and resistor 56 is connected to the noninverting input of amplifier 48. The anode of diode 57 is coupled to one-half $V_{CC}$ power supply 74. Capacitor 37 and resistors 34 and 35 form a low pass filter known as the syllabic filter. The output of amplifier 41 controls the polarity of slope polarity switch 58 and also the magnitude of the current from slope polarity switch 58 that is coupled to integrator amplifier 59. Capacitor 61 is in series with resistor 62 which are both in parallel to a resistor 63. This parallel combination is coupled from the inverting input of integrator amplifier 59 to the output of amplifier 59. Capacitor 61 and resistors 62 and 63 form an integrating network. The output of this integrating network is coupled to one of the inputs of comparator 21 through resistor 68 and line 71. Line 71 is coupled to ground reference by capacitor 67. The output of voltage source 74 is coupled to zero ground reference also by resistor 64 in parallel with capacitor 66. A resistor 76 is used to couple the output of supply 74 to the noninverting input of integrator amplifier 59. When the circuit of FIG. 3 is being used as an encoder, terminals 70 and 73 are not used. When the circuit of FIG. 3 is used as a decoder, terminal 26 along with capacitor 27 and line 71 are not used. In the decoder configuration the digital input signal is applied to terminal 73 and the reconstructed analog output signal is taken from terminal 70.

To set the idle channel step size the value of resistor 42 must be selected. With no input signal to circuit 20 the slope control algorithm is inactive. Therefore, a long series of ones or zeros never occurs and thus the voltage across the syllabic filter capacitor 37 would decay to zero volts. However, it should be noted that a voltage divider is formed by resistor 42 and resistors 34 and 35 which effectively appear between the voltage $V_{CC}$ and one-half the voltage $V_{CC}$ which sets the minimum allowed voltage across capacitor 37. That voltage divided by the resistance of resistor 45 must provide the desired ramps or step sizes at the comparator 21 input on line 71. Diode 57 provides a companding ratio reference for comparator or amplifier 48. This companding ratio reference is equal to one diode drop which is typically seven-tenths of a volt. In one prior art encoder/decoder circuit amplifiers 48 and 49 along with all their associated resistors and diode 57 were replaced by substituting in place of resistor 45 a series of resistors wherein some of the resistors were shunted with one or more diodes. This provided a non-linear response, however, it was an open loop control which was highly sensitive to temperature variations because of the temperature coefficient of the diodes.

One of the unique features of the encoder/decoder of FIG. 3 is the step size control circuit which uses a companding ratio reference, the present step size, and the present syllabic filter output to establish the optimum companding ratio as step sizes for any given input level. The companding ratio of a continuously variable slope delta modulation encoder/decoder is defined as the duty cycle of the coincidence output. In the circuit of FIG. 3 the coincidence output occurs on line 33. The companding ratio is a parameter measured by the syllabic filter and is the voltage appearing across capacitor 37 divided by the voltage swing of the coincident output. The voltage swing of the voltage appearing on line 33 is equal to the output of source 74 which is equal to $V_{CC}$ divided by two in the preferred embodiment. The instant operating companding ratio is analoged by the voltage out of source 74 and the voltage appearing at line 39 due to the virtual short across the input pins of amplifier 41 which serves as a voltage to current operational amplifier within the integrated circuit 20. Thus, the instantaneous companding ratio of the encoder/decoder is always available at the inverting input of amplifier 48. The diode 57 and the gain of amplifiers 48 and 49 provide companding ratio reference for any input level. If the output of amplifier 49 is more than the diode drop below the voltage supplied by source 74 then the noninverting input of amplifier 48 is equal to the voltage supplied by source 74 minus the diode drop voltage. In the preferred embodiment, the diode drop at the input of amplifier 48 represents a 12% companding ratio which is derived by dividing the diode voltage drop by the voltage source of the voltage supplied by source 74 or is seven-tenths of a volt divided by six volts since the voltage, $V_{CC}$, applied to terminal 40 is 12 volts. The voltage reference supplied by diode 57, of course, could be supplied by some other means, however, the diode voltage drop proves to be very convenient in the embodiment illustrated.

The instantaneous step size of an operating encoder/decoder is directly related to the voltage across resistor 45 which establishes the current for the integrating network. The voltage across resistor 45 is amplified by the differential amplifier 49 whose output is single ended with respect to voltage source 74. For large signal inputs, the step size is large and the output of amplifier 49 is less than one diode drop in volts. Therefore, diode 57 would be forward biased. The present or instant step size is not a factor in the step size control, however, the difference between 12% companding ratio and the instantaneous companding ratio appearing at line 39 is amplified by amplifier 48. The output of amplifier 48 changes the voltage across resistor 45 in a direction which reduces the difference between the companding reference and the operating ratio by changing the step size. The ratio of resistors 51 and 52 to resistors 53 and 54 determines how closely the voltage on line 39 will be forced to 12%. The selection of resistors 51, 52, 53, and 54 can be experimentally done initially, however, the resulting companding control is dependent on the value of resistors 45, 51, 52, 53, and 54 and the full diode drop of diode 57 and these values are easy to reproduce from one circuit 20 to another circuit 20. For small input signal levels the companding ratio reference becomes the output of amplifier 49 rather than the diode drop from diode 57. The operating companding ratio on line 39 is then compared to a companding ratio smaller than 12% which is determined by the voltage drop across resistor 45 and the gain of amplifiers 49 and 48. With no input signal, the companding ratio on line 39 goes to zero and the voltage across resistor 45 goes to zero. The voltage at the output of amplifier 49 becomes zero also since there is no drop across resistor 45 and, accordingly, with no signal input the actively controlled step size vanishes. In one test of the circuit of FIG. 3 it was found that a smooth 2 dB drop can be realized from an input signal level of plus 12 dBM to minus 24 dBM under the control of amplifier 48. At minus 24 dBM amplifier 49 begins to degenerate the companding reference and the resulting step size is reduced so as to extend the dynamic range of the encoder/decoder by 20 dBM. The active closed-loop companding network produces improved performance with higher frequencies. It has been found that the 0 dBM slope overload point of the circuit is raised to 4.8 KHz because of the gain available in controlling the voltage across resistor 45.

The integrated circuit 20 is sold by MOTOROLA, INC., as a continuously variable slope delta modulator/demodulator MC3418. By way of example only, some of the values of the components of FIG. 3 are given below:

Resistor 34—6 K ohms
Resistor 35—3 K ohms
Capacitor 37—1 microfarad
Resistor 42—500 K ohms
Resistor 43—33 K ohms
Resistor 44—200 K ohms
Resistor 45—4.3 K ohms
Resistor 51—15 K ohms
Resistor 52—15 K ohms
Resistor 53—200 K ohms Resistor 54—200 K ohms
Resistor 56—1 K ohms
Diode 57—1N914
Amplifier 48—MC1558
Amplifier 49—MC1558
Capacitor 27—2.6 microfarads
Capacitor 67—0.15 microfarads
Capacitor 66—0.1 microfarads
Resistor 72—600 ohms
Resistor 76—13 K ohms
Resistor 68—600 ohms
Resistor 64—1.5 K ohms
Capacitor 61—0.05 microfarads
Resistor 62—600 ohms
Resistor 63—13 K ohms By now, it should be appreciated that there has been provided means to improve the dynamic range of an encoder/decoder of the type using delta modulation.

While the present invention has been described with reference to particular embodiments and exemplifications thereof in accordance with the Patent Statutes, it is to be understood that modifications may be made by those skilled in the art without actually departing from the invention. Therefore, it is intended in the appended claims to cover all such equivalent variations as come within the spirit and scope of the invention.

What is claimed as new and desired to secure by Letters Patents of the United States is:

1. A continuously variable slope delta modulation circuit for encoding/decoding input signals, comprising: a comparator having a first input, a second input and an output, the first input being for receiving input information; a sampler having a first and a second input and an output, the first input being adapted for receiving clock pulses, and the second input being coupled to the output of the comparator; an integrator having an input and an output, the output being coupled to the second input of the comparator; a slope polarity switch having a first input, a second input, and an output, the output being coupled to the input of the integrator, the first input of the slope polarity switch being coupled to the output of the sampler; a level detect algorithm having an input and an output, the input being coupled to the output of the sampler; a first amplifier having a first input, a second input, and an output, the first and second inputs forming a differential input, the first input of the first amplifier being coupled to the output of the level detect algorithm; a companding ratio reference coupled to the second input of the first amplifier, the output of the first amplifier coupled to the second input of the slope polarity switch; and a second amplifier having a first input, a second input, and an output, the output being coupled to the second input of the first amplifier, the first and second inputs forming a differential input, the first input being coupled to the output of the level detect algorithm, and the second input being coupled to the output of the first amplifier.

2. The circuit of claim 1 wherein the companding ratio reference includes a diode to provide a diode voltage drop for use as a reference voltage.

3. The circuit of claim 1 further including a filter coupled to the output of the level detect algorithm.

4. A continuously variable slope delta modulation circuit for encoding analog signals and decoding digital signals and having a non-linear slope magnitude controller for controlling an integrator within the circuit, comprising: a means for receiving input data and adapted for receiving clock pulses to clock the data through the means for receiving; means to monitor at least three bits of data from the means for receiving wherein the at least three bits correspond to the last bits of data out of the means for receiving, the means to monitor providing a coincidence output whenever all the bits being monitored are of an identical logic level; a means to provide a difference signal coupled to the means to monitor; a companding ratio reference coupled to the means to provide and providing a reference input to the means to provide so the means to provide can provide the difference signal; means to couple the output of the means to provide to the companding ratio reference to provide a closed-loop controlled companding ratio reference; a slope polarity switch having a first and a second input and an output; the first input being coupled to the means for receiving and the second input being coupled to the output of the means to provide; and an integrator coupled to the output of the slope polarity switch and providing an analog output reconstructed from an output of the means for receiving.

5. The continuously variable slope delta modulation circuit of claim 4 wherein the means to provide includes a low pass filter which is charged by the coincidence output.

6. The continuously variable slope delta modulation circuit of claim 5 wherein the means to provide further includes means to compare and amplify any difference between the coincidence output and the companding ratio reference.

7. A circuit having a continuously variable slope delta modulator for encoding an analog signal to produce a digital output signal, comprising: a comparator for receiving the analog signal; a sampler for sampling the analog signal at a rate established by a clock signal, the sampler being coupled to the comparator to receive an output from the comparator; a logic level detector to produce a coincidence output when at least three successive logic bits from the sampler are of identical logic level value; a slope magnitude controller coupled to the logic level detector to receive the coincidence output and to provide a companding ratio signal; a companding ratio reference coupled to the slope magnitude controller for providing a reference to the magnitude controller; means to couple an output from the slope magnitude controller to the companding ratio reference so that the output of the slope magnitude controller can modify the reference provided by the companding ratio reference thereby providing a non-linear closed-loop controlled companding ratio reference; a slope polarity switch coupled to the magnitude controller and to an output of the sampler, the polarity switch being controlled by an output of the magnitude controller; and an integrator coupled to the slope polarity switch for integrating an output from the slope polarity switch and for providing a controlling input to the comparator.

8. The circuit of claim 7 further including a low pass filter coupled between the logic level detector and the non-linear slope magnitude controller.

9. The circuit of claim 8 wherein the slope magnitude controller includes means for comparing an output from the low pass filter against an output from the companding ratio reference and amplifying any difference therebetween.

10. The circuit of claim 7 wherein the companding ratio reference includes a diode to provide a diode voltage drop for use as a reference voltage.

11. A monolithic integrated circuit encoder/decoder capable of converting an analog signal to a digital signal and capable of reconstructing an analog signal from a digital signal of the type including a delta modulation circuit and having an integrator, the improvement comprising: means for providing a companding ratio reference; and means for comparing the companding ratio reference against a filtered coincidence output from the encoder/decoder and amplifying any difference therebetween to provide gain control for the integrator wherein the means for comparing includes a first operational amplifier for comparing and amplifying and having an output coupled to the encoder/decoder, and a second operational amplifier for comparing the filtered coincidence output against the output of the first operational amplifier and providing an output coupled to the means for providing thereby being capable of overriding the companding ratio reference to provide a non-linear closed-loop companding ratio control for the encoder/decoder.

12. The encoder/decoder of claim 11 wherein the means for providing includes at least one diode drop to provide the companding ratio reference.

13. An encoder/decoder capable of converting an analog signal to a digital signal and converting a digital signal to an analog signal of the type having a delta modulator/demodulator, a logic level coincident detector, and a low pass filter wherein the improvement comprises a first amplifier having an inverting and a non-inverting input and an output, the inverting input being coupled to the low pass filter, the output being coupled to the delta modulator/demodulator; means for providing a companding ratio reference and having an output coupled to the non-inverting input of the first amplifer; and a second amplifier having an inverting and a non-inverting input and an output coupled to the output of the means for providing, the inverting input being coupled to the output of the first amplifier and the non-inverting input being coupled to the low pass filter so that the improvement provides a closed-loop controlled companding ratio.

14. The encoder/decoder of claim 13 wherein the means for providing the companding ratio reference has at least one diode to provide at least one diode voltage drop for the output which is coupled to the non-inverting input of the first amplifier.

* * * * *